United States Patent [19]
Daito et al.

[11] Patent Number: 6,013,873
[45] Date of Patent: Jan. 11, 2000

[54] PHOTOVOLTAIC APPARATUS AND METHOD OF MANUFACTURING A PHOTOVOLTAIC APPARATUS

[75] Inventors: Naoki Daito, Mihara-gun; Toshihiro Nomura, Sumoto; Ryuji Okawa, Mihara-gun; Koji Katsube; Yoshinobu Takabatake, both of Sumoto, all of Japan

[73] Assignee: Sanyo Electric Co., Ltd., Osaka, Japan

[21] Appl. No.: 09/015,330

[22] Filed: Jan. 29, 1998

[51] Int. Cl.[7] ...................................................... H01L 31/04
[52] U.S. Cl. .......................... 136/256; 136/244; 136/243; 136/252; 257/466; 257/443; 257/431; 257/622; 438/73; 438/57; 438/58; 438/68
[58] Field of Search ..................................... 136/244, 243, 136/256, 252; 257/466, 443, 431, 622; 438/73, 57, 58, 68

[56] References Cited

U.S. PATENT DOCUMENTS 5,688,366  11/1997  Ichinose et al. ........................ 136/256
5,717,255  2/1998  Haga et al. ............................. 257/781

FOREIGN PATENT DOCUMENTS 7-231015  8/1995  Japan .

*Primary Examiner*—Alan Diamond
*Attorney, Agent, or Firm*—Wenderoth, Lind & Ponack, L.L.P.

[57] ABSTRACT

A photovoltaic apparatus includes a first conductive layer, a semiconductor layer and a second conductive layer on a substrate. The first conductive layer is divided into a first electrode layer and into a peripheral first electrode layer by the lower peripheral groove filled up with a first peripheral insulating material. The first upper peripheral groove is provided at the upper portion of the lower peripheral groove, to divide the semiconductor layer and the second conductive layer. The second peripheral insulating material is provided at the outer region of the lower peripheral groove to divide the semiconductor layer. The second upper part peripheral groove is provided at the upper part of the second peripheral insulating material to divide the semiconductor layer and the second conductive layer.

18 Claims, 4 Drawing Sheets

PHOTOVOLTAIC APPARATUS AND METHOD OF MANUFACTURING A PHOTOVOLTAIC APPARATUS

BACKGROUND OF THE INVENTION

The present invention relates to a photovoltaic apparatus and tle method of manufacturing photovoltaic apparatus.

The structure and the manufacturing process of a prior art photovoltaic apparatus consisting in dividing a photovoltaic region formed by a stacked layer body composed of a first electrode, a semiconductor photo-active layer and a second electrode placed at the center on a substrate, and a non-photovoltaic region located at the outer circumference on the substrate, has been for example described in Japanese Non-examined Patent Publication No. 7-231015 issued on Aug. 29, 1995. The manufacturing method described in the publication is realized by the following steps: forming a first conductive layer, forming a first electrode on an insulated substrate, forming and dividing the formerly mentioned first electrode and forming a lower peripheral groove at the inner side of the whole circumference of the substrate separating the first conductive layer, setting the peripheral insulating material in the lower peripheral groove, forming a stacked layer body of a semiconductor layer including a semiconductor photo-active layer at almost the whole surface on top of the first conductive layer and the second conductive layer including the second electrode, and forming and separating the semiconductor photo-active layer and the second electrode by irradiating an energy beam on the peripheral material from a direction of the exposure of the second electrode and by taking off the semiconductor layer and the second conductive layer of the irradiated part thereby forming an upper part peripheral groove reaching the peripheral insulating material. Then, a protection layer is laid provided on almost the whole surface of the substrate including on the second electrode, to improve the waterproofing.

When a photovoltaic apparatus, which has been manufactured according to the prior art manufacturing method, is used outdoors for a long period of time, the moisture penetrates inside the lateral face of the outer circumference of the substrate, then in the outer circumference of the substrate, the second conductive layer, the semiconductor layer and the outer peripheral insulating material corrode and exfoliate. The moisture penetrates furthermore and the second electrode of the photovoltaic region and the semiconductor active layer corrode and exfoliate which leads to lower output characteristics. On the other hand the appearance is not acceptable because these parts corrode and exfoliate on the photo-receptive side which is visible of the photovoltaic apparatus.

SUMMARY OF THE INVENTION

The present invention has been developed to solve these drawbacks and has the scope to offer a waterproof photovoltaic apparatus and the method of manufacturing thereof. The above and further objects and features of the invention will more fully be apparent from the following detailed description with accompanying drawings.

The photovoltaic apparatus of the present invention separates the semiconductor film and the second conductive layer by mean of a first upper peripheral groove on the first peripheral insulating material located at an inner region of the whole outer circumference of the substrate, and of the second upper peripheral groove on the second outer peripheral insulating material placed at the outer region of the first upper peripheral groove.

With the photovoltaic apparatus of this structure, by separating the semiconductor layer and the second conductive layer by mean of the first upper peripheral groove on the first peripheral insulating material located at inner region of the whole periphery of the substrate, and by means of a second upper peripheral groove on the second peripheral insulating material placed at the outer region of this first upper peripheral groove, it is possible to prevent the corrosion and the exfoliation of the first conductive layer, of the semiconductor layer and of the second conductive layer due to the penetration of moisture from the outer circumference of the substrate.

Furthermore, by electrically separating the second conductive layer by the first upper peripheral groove and by the second upper peripheral groove, it is possible to reduce the lowering of the characteristics due to the conduction between each photovoltaic region via the second conductive layer material which unexpectingly adheres of the side face or to the reverse face of substrate.

BRIEF DESCRIPTION OF THE DRAWINGS

FIGS. 1(a)–1(c) are figures showing a first process of one embodiment of the present invention in which FIG. 1(a) is a plane view, FIG. 1(b) is a cross-sectional view taken along the line A—A' of FIG. 1(a), and FIG. 1(c) is a cross-sectional view taken along the line B—B of FIG. 1(a).

FIGS. 2(a)–2(c) are figures showing a second process of one embodiment of the present invention in which FIG. 2(a) is a plane view, FIG. 2(b) is a cross-sectional view taken along the line A—A' of FIG. 2(a), and FIG. 2(c) is a cross sectional view taken along the line B—B' of FIG. 2(a).

FIGS. 3(a)–3(c) are figures showing a third process of one embodiment of the present invention in which FIG. 3(a) is a plane view, FIG. 3(b) is a cross-sectional view taken along the line A—A' of FIG. 3(a), and FIG. 3(c) is a cross-sectional view taken along the line B—B' of FIG. 3(a).

FIGS. 4(a)–4(c) are figures showing a fourth process of one embodiment of the present invention in which FIG. 4(a) is a plane view, FIG. 4(b) is a cross-sectional view taken along the line A—A' of FIG. 4(a), and FIG. 4(c) is a cross-sectional view taken along the line B—B' of FIG. 4(a).

DETAILED DESCRIPTION OF THE INVENTION

The following is a detailed description using FIG. 1 to FIG. 4 of one embodiment of the manufacturing method of the photovoltaic apparatus of the present invention.

Figure 1A:
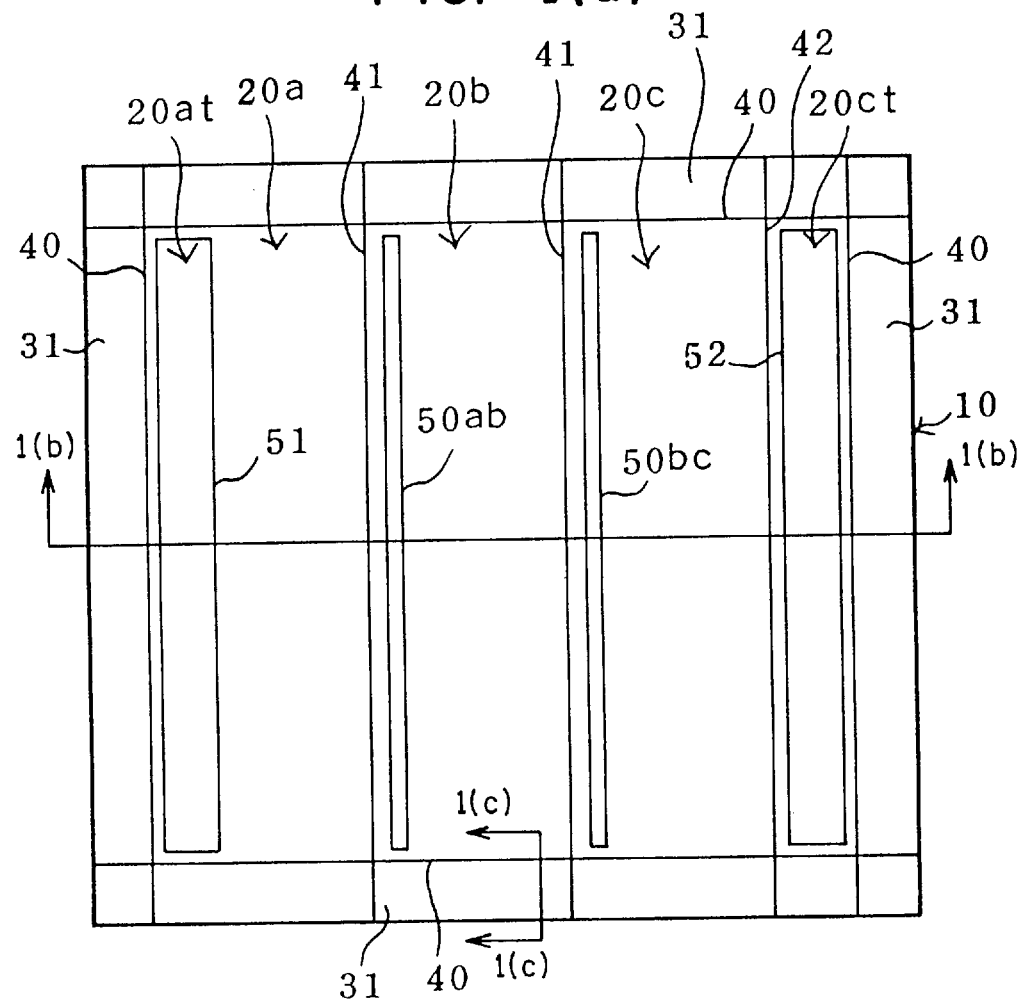
Figure 1B:
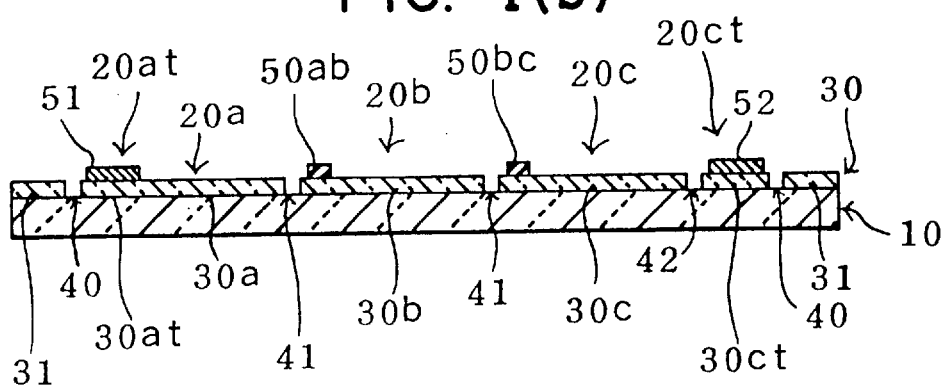
Figure 1C:
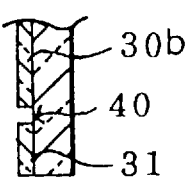

Initially, in FIG. 1, 10 denotes a rectangular insulating substrate made of light transparent glass or other material, 20a–20c denote photovoltaic regions composed of a staked layer body made of a first electrode layer, of a semiconductor photo-active layer and of a second electrode layer. Furthermore, 20at and 20ct denote left edge and right edge output terminal regions which produce the output from the photovoltaic apparatus.

Then, in the process shown in FIG. 1, a first conductive layer 30 (about 0.07 to 1.0 μm in thickness) comprising a transparent conductive film made of zinc oxide (ZnO), tin indium oxide (ITO), tin oxide ($SnO_2$) or the like, is provided on the whole surface of the substrate 10.

Further, at an inner region of each side of the substrate 10, a lower peripheral groove 40 is formed (about 20 to 100 μm in width) by irradiating an energy beam of a laser beam or of an electron beam along a straight line, and by removing the irradiated part of the first conductive layer. By this process, a peripheral first electrode layer 31 is formed at the outer region of the lower peripheral groove 40. Also, in the spaces between each photovoltaic region, in the space between the photovoltaic region 20c and the right edge output terminal region 20ct, grooves 41 between the regions and terminal groove 42 (about 20 to 100 μm in width) are formed by irradiating an energy beam along a straight line, like a laser beam or an electron beam and by removing the irradiated part of the first conductive layer. According to this process, the first electrodes 30a–30c corresponding to each photovoltaic region and the right edge first conductive layer 30ct are separately formed and also, the left edge extending first conductive layer 30at extending from the first electrode 30a to the left edge output terminal region 20at is formed.

Then, the conductive bars 50ab, 50bc comprising a silver paste or the like, are set parallel to the grooves 41 between the regions, on the left edge of the first electrodes 30b, 30c. Also, the conductive bars 51, 52 having a belt shape are set, parallel to the lateral edges of the substrate 10, on the left edge extending first conductive layer 30at and on the right edge first conductive layer 30ct, respectively. Further, the conductive bars 50ab, 50bc, 51, 52 are patterned through a screen printing process, and the conductive bars 50ab, 50bc, 51, 52 include a silver or nickel or aluminum powder (about 3–7 μm in particle dimensions) in a polyimidic or phenolic binder, then after they are calcinated at about 250–600 degrees centigrade and formed with a height of about 10–50 μm and a width of about 0.2–0.6 mm.

Figure 2A:
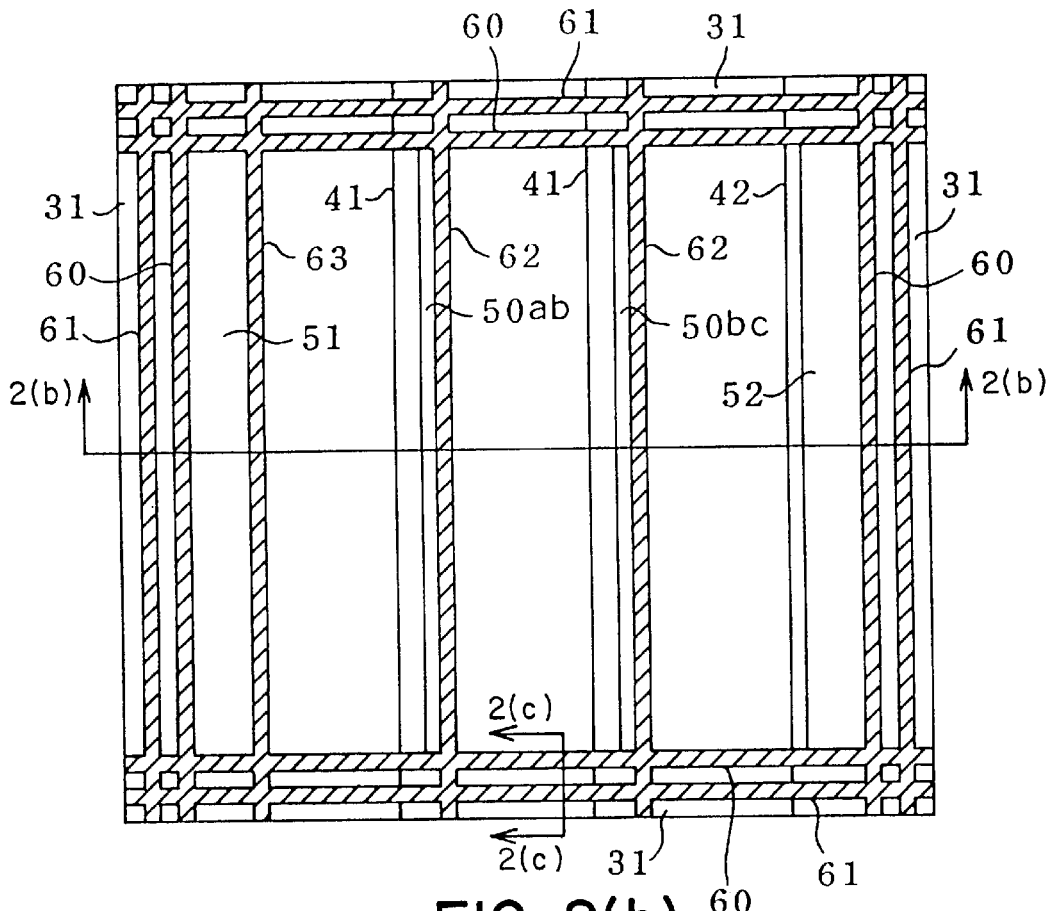
Figure 2B:
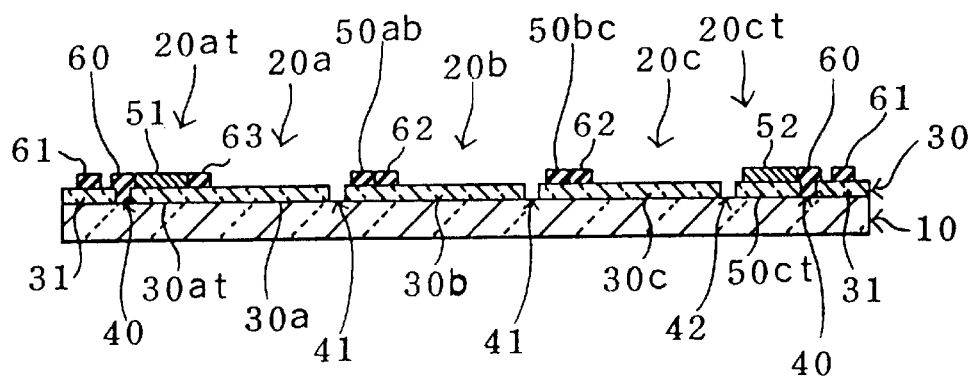
Figure 2C:
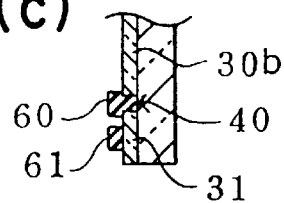

Then, in the process shown in FIG. 2, a first outer peripheral insulating material 90 is placed in the lower peripheral groove 40 located at an inner edge of the whole outer circumference of the substrate 10, and a second outer peripheral insulating material 61 is placed on the peripheral first electrode layer 31 outward of the first outer peripheral insulating material 60. Then insulating materials 62 between the regions are placed on the left sides of the first electrode 30b, 30c, respectively. Furthermore, a dividing insulating material 63 is placed on the left edge of the first electrode 30a. The insulating materials 60, 61, 62, 63 are shown by lines in the plane view of FIG. 2(a). These materials comprise a powder (about 1.5 to 7.0 μm in particle dimensions) of an inorganic material of silicone dioxide or the like in the polyimidic or phenolic binder, they are formed with a height of about 10 to 50 μm and a width of about 0.2 to 0.6 mm after having been patterned by screen printing and dried at a temperature between 250 and 600 degrees centigrade.

Figure 3A:
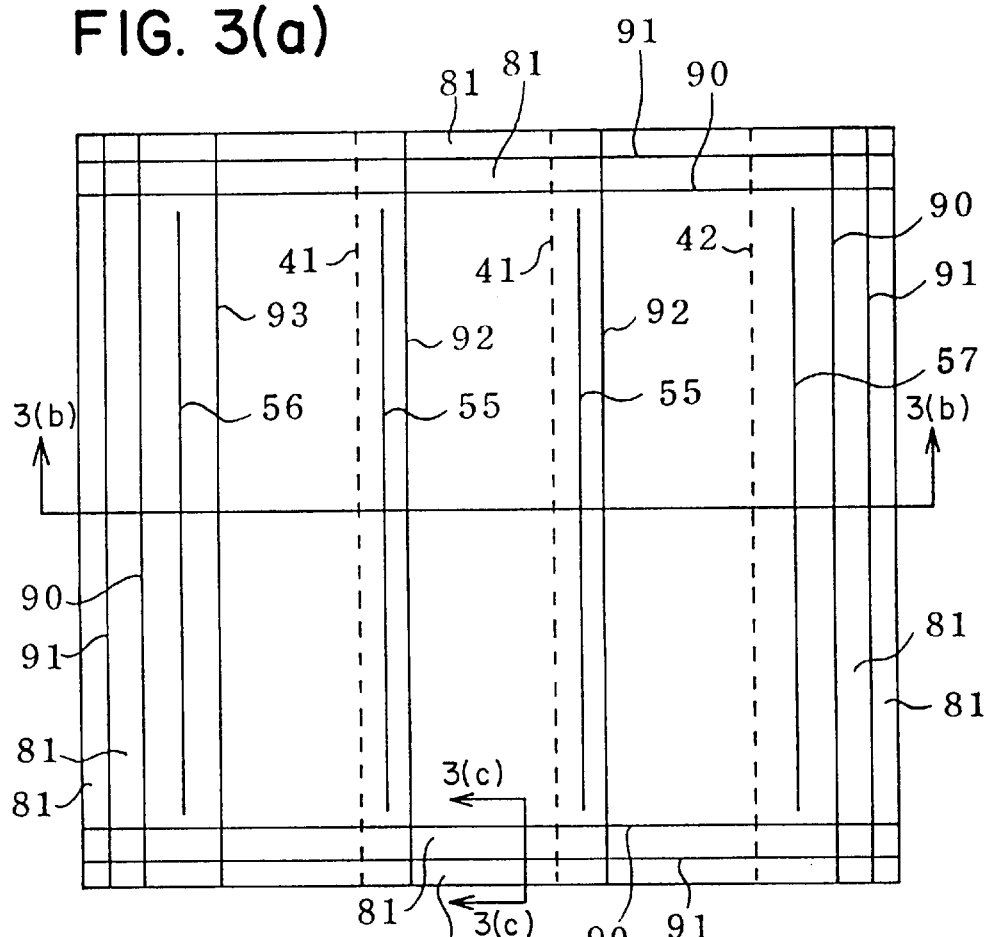
Figure 3B:
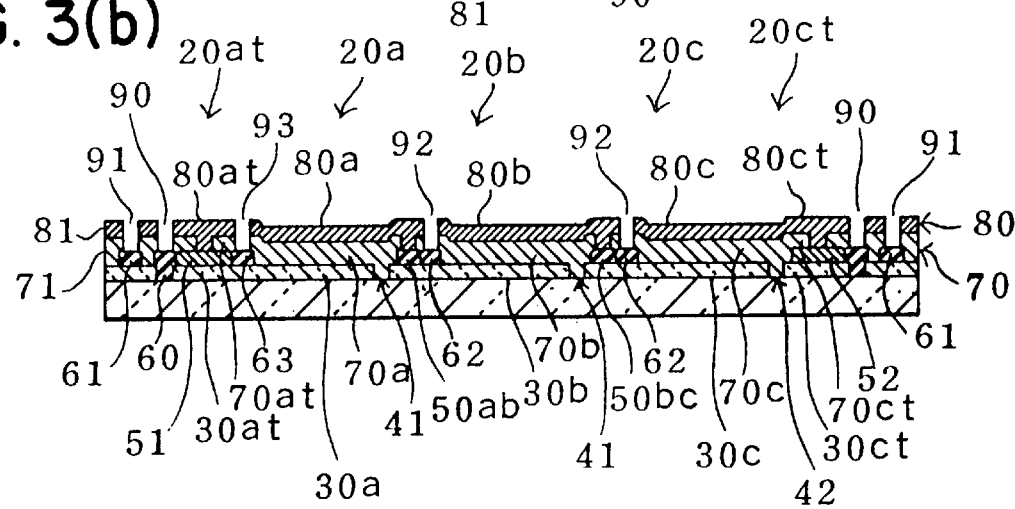
Figure 3C:
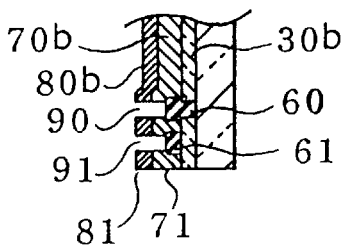

Then, in the process shown in FIG. 3, a stacked layer body of a semiconductor layer 70 and a second conductive layer 80 is formed on almost the whole surface of the substrate 10 to cover the first electrodes. The semiconductor layer 70 (about 0.3 to 1.0 μm in thickness) comprises a PIN or PN junction which may be made of amorphous silicon, amorphous silicon carbide, amorphous silicon germanium or the like. The second conductive layer 80 (about 0.1 to 1.0 μm in thickness) comprises the metallic layer made of aluminun, titanium or nickel.

Then, by irradiating the energy beam of a laser beam or an electron beam from the direction of the exposure of the second conductive layer 80, on the first peripheral insulating material 60, on the second peripheral insulating material 61, on the insulating material 62 and on the dividing insulating material 63, by removing the irradiated parts of the semiconductor layer 70 and of the second conductive layer 80, a first upper peripheral groove 90, a second upper peripheral groove 91, upper grooves 92 between the regions and a diving upper groove 93 (about 20 to 100 μm in width) respectively reaching each insulating material, are formed. Therefore, semiconductor photo-active layers 70a to 70c and second electrodes 80a to 80c are separated and formed corresponding to each photovoltaic region by the first upper peripheral groove 90, the upper grooves 92 between the regions, the dividing upper groove 93. Furthermore, a peripheral semiconductor layer 71 and a peripheral second electrode layer 81 are formed on the peripheral part of the substrate 10. In addition, a semiconductor layer 70at made of the semiconductor layer material and a second electrode pad 80at made of the second conductive layer material are separated and formed in the left edge output terminal region 20at. On the other hand, a semiconductor layer 70ct extended from the semiconductor photo-active layer 70c and a second electrode extending part 80ct extending from the second electrode 80c are formed in the right edge output terminal region 20ct.

Furthermore, the energy beam of a laser beam or an electron beam or the like is irradiated on the parts located on the conductive bars 50ab, 50bc, 51 and 52 from the exposure side of the second conductive layer. By this process, the conductive bars 50ab, 50bc and the second electrode 80a, 80b are respectively melted and electrically connected, then each photovoltaic region 20a to 20c is connected in series. The melted portions are shown in FIG. 3 as reference numerals 55, 56 and 57. Then, the conductive bar 51 and the second electrode pad 80at are electrically connected in the left edge output terminal region 20at, allowing to lead out the output from the first electrode layer 20a. Furthermore, the conductive bar 52 and the second electrode extending part 80ct are electrically connected in the right edge output terminal region 20ct, decreasing the electrical resistance at the output terminal by conductive bars 52 thereby raising the current collecting efficiency.

Figure 4A:
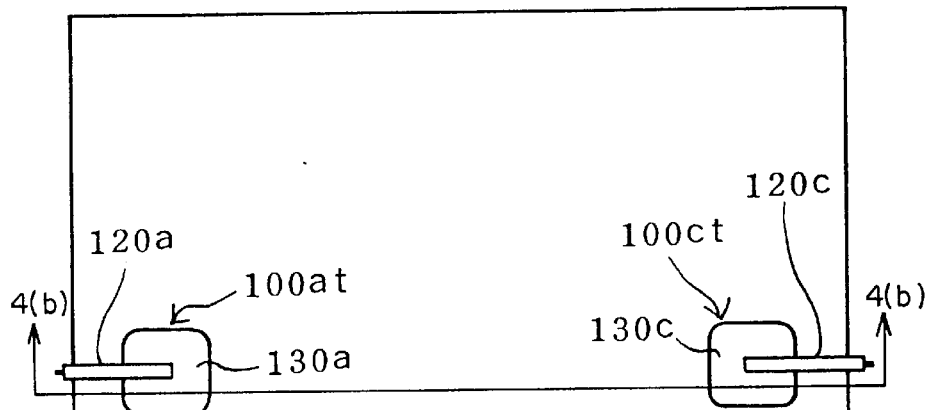
Figure 4B:
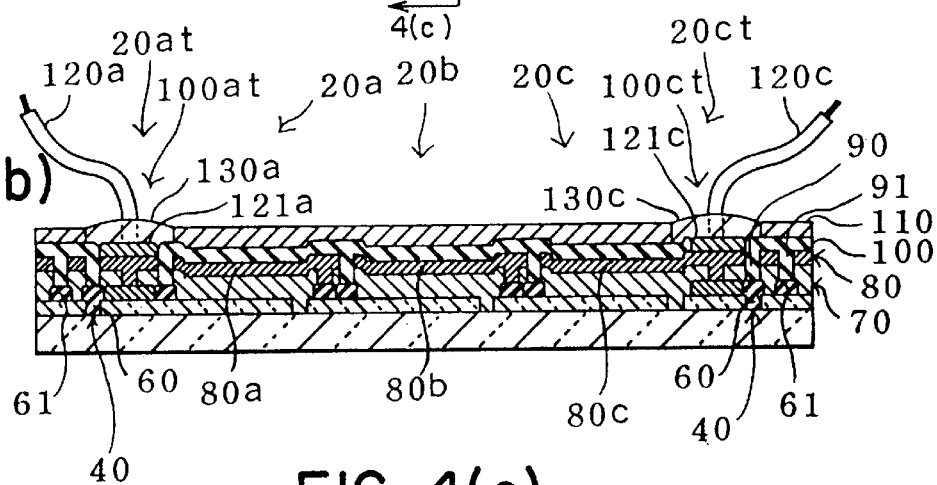
Figure 4C:
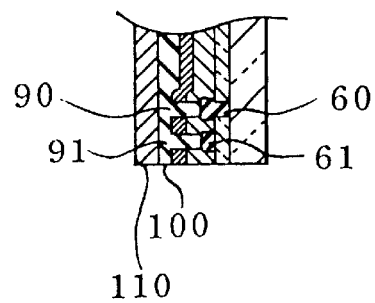

In the process shown in FIG. 4, the protection layer 100, which comprises epoxy, phenol resins or the like, is provided on almost the whole surface of the substrate 10 to cover the second electrodes 80a to 80c except on rectangular connecting regions 100at, 100ct located at the middle of the left and right edge output terminal regions 20at, 20ct. The protection layer 100 is formed by screen-printing the paste-like resin raw material including the solvent in the pattern, then drying the material at a temperature between 100 and 150 degrees centigrade. The protection layer 100 is about 20 to 50 μm in thickness. Then, a protection film 110 is provided on almost the entire surface of the substrate 10 including the protection layer 100. The protection film 110 has a thickness of 25 to 1000 μm and comprises polyethylene terephtalate(PET), fluorine resin or the like. The protection film 110 has openings corresponding to the connecting regions 100at and 100ct. The protection film 110 is originally coated with an adhesive layer made of thermoplastic resin (not shown in the figure), then is laminated by means of a heat roller. Furthermore, instead of the laminating method, it is also possible to use a method of heat pressing under a vacuum condition. Here, the reason for placing the protection film 110 in addition to the protection layer 100, is that pin holes, that allow moisture penetration, may be formed in the protection layer 100 formed by screen printing, the protection film 110 surely prevents the penetration of the moisture. Also, the protection film 110 prevents the dispersion of broken pieces when the substrate, made of glass is damaged.

Then after soldering lead wires 120a, 120c using soldering layers 121a, 121c, in the connecting regions 100at, 100ct, in order to protect corrosions of the soldering layers 121a, 121c and increase the adhesions of the lead wires 120a, 121c, the rein compensation coating layers 130a, 130c are laid on the soldering layers 121a, 121c. The photovoltaic apparatus of the present embodiment is realized by the method of the present invention.

Thereafter, a comparison test of the photovoltaic apparatus of the present invention has been conducted to check the exfoliation-proof properties. The two following types of photovoltaic apparatuses have been prepared.

1. A photovoltaic apparatus in accordance with the present invention.
2. A comparison embodiment (the photovoltaic apparatus of the present invention but without the second peripheral insulating material 61 and without the second upper peripheral groove 91).

Then the two apparatuses were plunged in a brine solution salted at 5% and left outdoors. As a result, no exfoliation appeared in the photovoltaic region of the photovoltaic apparatus of the present embodiment after 30 days. On the comparison embodiment, the exfoliations started from the outer circumference of the substrate after the fifth day, and progressed towards the inside of the photovoltaic region. From these results it has been confirmed that exfoliation-proof properties of the present embodiment have been improved.

Furthermore, the reason why the exfoliation-proof properties of the present embodiment have been improved, can be explained as follows. At first, about the exfoliation between the second conductive layer that is a metal layer and the semiconductor photo-active layer, the surface of the second peripheral insulating material 61 is irregular as it includes a powder of inorganic material. And the second conductive layer and the semiconductor layer adhere on this irregular surface of the second peripheral insulating material 61 except the second upper peripheral groove 91. Therefore, the adhesion strength force becomes stronger. Then, the exfoliation between the second conductive layer and the semiconductor photo-active layer which has progressed from the outer circumference of the substrate can be stopped on the second peripheral insulating material 61.

Furthermore, regarding the exfoliation that occurs between the first conductive layer comprising the transparent conductive film and the second peripheral insulating material 61 formed on the first conductive layer, the adhesion strength between these is good compared with the adhesion strength of the first conductive layer and the semiconductor photo-active layer. Then the exfoliation between the first conductive layer and the semiconductor layer, that has progressed from the outer circumference of the substrate, can be stopped here.

Furthermore, the material of the protection layer 100 comprises resin is filled up into the second upper peripheral groove 91 on the second peripheral insulating material 61, and can strongly adhere to the second peripheral insulating material 61 which also comprises resin because these comprise resin. Therefore, the moisture which has progressed form the outer circumference of the substrate can hardly cross this area thereby reducing the moisture penetration inside the photovoltaic regions, and thus allowing reduction of the exfoliation inside the photovoltaic regions.

Further, hereunder is the explanation of the advanced effects of the present embodiment. In the present embodiment, the second conductive layer is separated into each photovoltaic region and the external edge peripheral second electrode layer by the first upper peripheral groove 90 on the first peripheral insulating material 60. When there are temporarily no first upper peripheral groove 90 and no second upper peripheral groove 91, each photovoltaic region becomes conductive through the second conductive layer material which has unexpectingly adhered to the side face or the reverse face of the substrate 10, and the output of the photovoltaic apparatus can no longer be produced with normal characteristics. Therefore, to prevent this problem, only the structure of the first upper peripheral groove 90 of the present embodiment is explained in Japanese Non-examined latent Publication No. 7-231015 issued on Aug. 29, 1995.

Nevertheless, it is difficult to perfectly electrically separate the second conductive layer only by the first upper peripheral groove 90, for example, due to the accidental lowering of the output of the energy beam or due to the unevenness of the film thickness of the semiconductor layer and that of the second conductive layer, it often occurs that the second conductive layer cannot be sufficiently electrically separated. However, in the present embodiment, even in these cases it is possible to reduce to the minimum the above-mentioned poor characteristics because the second conductive layer is furtheremore separated by the second upper peripheral groove 91.

Furthermore, in the present embodiment, the first electrode and the substrate are transparent and light enters through this side, but the second electrode, the protection layer and the protection film can be made transpararent so that light can be introduced from this side.

As this invention may be embodied in several forms without departing from the spirit or essential characteristics thereof, the present embodiment should is therefore be considered illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A photovoltaic apparatus comprising:
   a substrate having an insulating surface;
   a first conductive layer formed on said insulating surface of said substrate;
   a semiconductor layer placed on said first conductive layer;
   a lower peripheral groove formed in said first conductive layer so as to divide said first conductive layer into an inner electrode layer and an outer electrode layer, said lower peripheral groove being spaced inwardly and extending along the entire circumference of said substrate, wherein said lower peripheral groove is filled with a first insulating material;
   a second conductive layer formed on said semiconductor layer;
   a first upper peripheral groove located over said lower peripheral groove, said first upper peripheral groove dividing said semiconductor layer and said second conductive layer;
   a second insulating material laminated on said first conductive layer outwardly of said lower peripheral groove and being spaced inwardly and extending along the entire circumference of said substrate; and
   a second upper peripheral groove, located above said second insulating material, dividing said semiconductor layer and said second conductive layer.

2. The photovoltaic apparatus as claimed in claim 1, wherein said second insulating material comprises an inorganic powdered material in a binder.

3. The photovoltaic apparatus as claimed in claim 2, wherein said second insulating material has a roughened surface.

4. The photovoltaic apparatus as claimed in claim 1, wherein said second upper peripheral groove is parallel to said first upper peripheral groove.

5. The photovoltaic apparatus as claimed in claim 1, wherein a portion of said first insulating material extends into said first tipper peripheral groove formed in said semiconductor layer.

6. The photovoltaic apparatus as claimed in claim 1, wherein said second upper peripheral groove is filled with a resin material.

7. The photovoltaic apparatus as claimed in claim 1, further comprising a protection layer covering said second conductive layer, said protection layer being formed of a resin material and extending into said second upper peripheral groove.

8. The photovoltaic apparatus as claimed in claim 1, further comprising a protection layer covering said second conductive layer, said protection layer being formed of a resin material and extending into said first and second upper peripheral grooves.

9. A method of manufacturing a photovoltaic apparatus comprising:

forming a first conductive layer on substantially the entire upper surface of a substrate having an insulating surface;

forming a lower peripheral groove in said first conductive layer, said lower peripheral groove dividing said first conductive layer into a first inner electrode layer and a first peripheral electrode layer, wherein said first inner electrode layer is located in an inner region of said lower peripheral groove and said first peripheral layer is extending in an outer region of said lower peripheral groove;

placing a first peripheral insulating material in said lower peripheral groove;

placing a second peripheral insulating material outwardly of said lower peripheral groove on said first peripheral electrode layer;

forming a semiconductor layer and a second conductive layer on said first conductive layer;

dividing said semiconductor layer and said second conductive layer by directing an energy beam from a direction of exposure of said second conductive layer toward said first peripheral insulating material and said second peripheral insulating material; and removing irradiated portions of said semiconductor layer and said second conductive layer to thereby form a first upper peripheral groove and a second upper peripheral groove extending to said first peripheral insulating material and said second insulating material, respectively.

10. The method of manufacturing a photovoltaic device as claimed in claim 9, further comprising combining an inorganic powdered material with a binder to form said second insulating material.

11. The method of manufacturing a photovoltaic device as claimed in claim 9, further comprising combining an inorganic powdered material with a binder to form said second insulating material, wherein said second insulating material has a rough surface.

12. The method of manufacturing a photovoltaic device as claimed in claim 9, wherein said second upper peripheral groove is placed so that it extends in parallel to said first upper peripheral groove.

13. The method of manufacturing a photovoltaic device as claimed in claim 9 wherein said first insulating material is provided so that it extends into a portion of said first upper peripheral groove formed in said semiconductor layer.

14. The method of manufacturing a photovoltaic device as claimed in claim 9, further comprising filling said second upper peripheral groove with a resin material.

15. The method of manufacturing a photovoltaic device as claimed in claim 9, further comprising forming a protective layer over said second conductive layer, wherein said protective layer is formed of a resin material and extends into and fills said second upper peripheral groove.

16. The method of manufacturing a photovoltaic device as claimed in claim 9, further comprising forming a protective layer over said second conductive layer, wherein said protective layer is formed of a resin material and extends into said second upper peripheral groove and said first peripheral groove.

17. The method of manufacturing a photovoltaic device as claimed in claim 9, further comprising providing a plurality of photovoltaic regions on said substrate and electrically connecting adjacent photovoltaic regions by dividing said first conductive layer by forming grooves, and by dividing said semiconductor layer and said second conductive layer by forming upper grooves.

18. A photovoltaic apparatus comprising:

a substrate having an insulating surface;

a first conductive layer formed on said insulating surface of said substrate;

a semiconductor layer placed on said first conductive layer;

a lower peripheral groove formed in said first conductive layer so as to divide said first conductive layer into an inner electrode layer and an outer electrode layer, said lower peripheral groove being spaced inwardly and extending along the entire circumference of said substrate;

a second conductive layer formed on said semiconductor layer;

a first upper peripheral groove being spaced inwardly and extending along the entire circumference of said substrate to divide said semiconductor layer and said second conductive layer; and a second upper peripheral groove being located outwardly of said first upper peripheral groove and extending along the entire circumference of said substrate to divide said semiconductor layer and said second conductive layer.

* * * * *